United States Patent [19]

Switzer

[11] Patent Number: 4,492,811

[45] Date of Patent: Jan. 8, 1985

[54] HETEROJUNCTION PHOTOVOLTAIC DEVICE

[75] Inventor: Jay A. Switzer, Placentia, Calif.

[73] Assignee: Union Oil Company of California, Los Angeles, Calif.

[21] Appl. No.: 518,814

[22] Filed: Aug. 1, 1983

[51] Int. Cl.³ .......................................... H01L 31/06
[52] U.S. Cl. .................................. 136/255; 136/259; 136/260; 136/261; 136/262; 136/264; 136/265; 357/16; 357/30
[58] Field of Search .............. 136/255, 256, 259, 260, 136/261, 262, 264, 265, 252, 254; 357/16, 30, 61

[56] References Cited

U.S. PATENT DOCUMENTS

| | | | |
|---|---|---|---|
| 2,877,284 | 3/1959 | Schultz | 136/255 |
| 4,149,902 | 4/1979 | Mauer et al. | 136/259 |
| 4,166,917 | 9/1979 | Dorfeld et al. | 136/259 |
| 4,191,593 | 3/1980 | Cacheux | 136/259 |
| 4,259,122 | 3/1981 | Purwin et al. | 136/258 |
| 4,360,702 | 11/1982 | Feng et al. | 136/261 |
| 4,366,335 | 12/1982 | Feng et al. | 136/255 |

OTHER PUBLICATIONS

R. Singh et al., "Review of Conductor-Insulator-Semiconductor (CIS) Solar Cells", Solar Cells, vol. 3, pp. 95-148 (1981).
J. F. McCann et al., "Photoelectrochemical Properties of n-Type $In_2O_3$", J. Electrochem. Soc., vol. 128, pp. 1719-1723 (1981).
V. N. Shukla et al., "Electrical Conduction in Single Crystal Thallic Oxide", J. Am. Ceramic Soc., vol. 60, pp. 253-258 (1977).
V. F. Drobny et al., "The Photovoltaic Properties of Thin Copper Oxide Films", Conf. Record, 13th IEEE Photovoltaic Specialists Conf., (1978), pp. 180-183.
I. Shih et al., "A Semiconductor-Insulator Semiconductor $CdO-SiO_2-Si$ Solar Cell", Solar Cells, vol. 7, pp. 327-330 (Dec. 1982).
J. Shewehun, J. Dubow, A. Myszkowski and R. Singh, J. Applied Physics, 49(2), p. 855 (1978).
A. K. Ghosh, C. Fishman and T. Feng, J. Applied Physics, 46(6), p. 3490 (1978).
J. B. Dubow, D. E. Burk and J. R. Sites, Applied Physics Letters, vol. 29, No. 8, p. 494 (1976).
J. C. Manifacier and L. Szepessy, Applied Physics Letters, vol. 31, No. 7, p. 459 (1977).

Primary Examiner—Aaron Weisstuch
Attorney, Agent, or Firm—Dean Sandford; Gregory F. Wirzbicki; Alan H. Thompson

[57] ABSTRACT

A heterojunction photovoltaic device, containing a highly conductive coating material having a band gap greater than 0 to about 3.0 e.V. on a substrate containing a semiconductor material, is utilized in highly efficient photovoltaic cells and radiometric detection cells.

41 Claims, 1 Drawing Figure

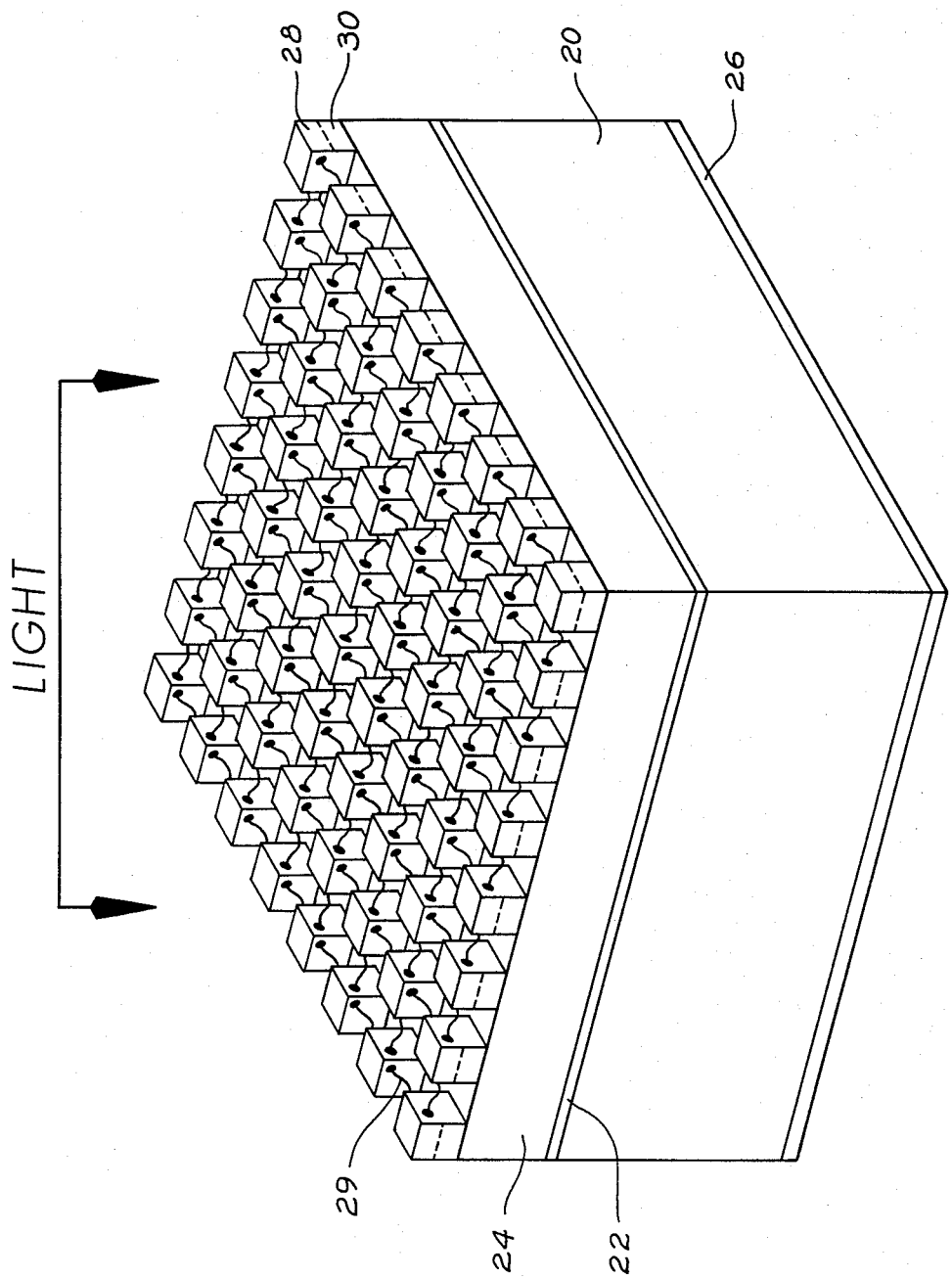

HETEROJUNCTION PHOTOVOLTAIC DEVICE

BACKGROUND OF THE INVENTION

1. Field of the Invention

The invention relates to heterojunction photovoltaic devices and, more particularly, to the utilization of heterojunction photovoltaic devices for producing electricity from semiconductor-insulator-semiconductor junction photovoltaic cells and for sensing objects by radiometric detection cells.

2. Description of the Prior Art

The solid-state heterojunction photovoltaic cell has recently received considerable attention. Such a cell utilizes at least two layers of materially different solids, one of which is generally a semiconductor to convert energy from light (usually solar energy) into electrical energy. These solid materials, according to the band theory of solids, contain atoms whose discrete electronic energy states have merged into energy bands of allowed energies for electrons. The energy required to excite electrons in such solid materials from a maximum energy in the valence band to a minimum energy in the conduction band represents the band gap energy. At approximately room temperature, valence and conduction energy bands of conductors such as metallic solids are not separated, i.e. they have a band gap of about 0. Semiconductor solid materials, on the other hand, are typically separated by a band gap of above 0 to less than about 4.0 e.V., while higher values are associated with insulator materials.

The most efficient utilization of terrestrial solar energy by semiconductor materials has been observed to occur with the absorption of photons associated with near-infrared light. Light-absorbing semiconductor materials having a band gap of approximately 1.4 e.V. tend to maximize the efficiencies of the conversion from solar to other forms of energy. In photovoltaic cells, electron-hole pairs are generated by the absorption of light in semiconductors. The electron and the hole of electron-hole pairs are separated at a metal-semiconductor (M-S) junction, a metal-insulator-semiconductor (M-I-S) junction, a semiconductor-semiconductor (S-S) junction, or at the junction of two semiconductors having a thin layer of insulator material between them (S-I-S), and are injected at respective sides of the junction to produce electrical energy. Holes and electrons move to the surface or bulk of the semiconductor, depending on their resistivity category, i.e. n-type or p-type.

One of the problems with heterojunction photovoltaic devices containing semiconductor materials is efficiency. A number of approaches have been taken to increase the efficiency of photovoltaic devices. In one approach, a cell with an M-I-S or S-I-S junction includes a coating material, such as a highly conductive metal like platinum, or a semiconductor having a wide band gap (i.e., $>3.0$ e.V.), such as $InO_2$ or $SnO_2$, on the surface of the photovoltaic device. However, the search continues for coating materials that impart higher efficiencies to semiconductors useful in heterojunction photovoltaic cells.

Accordingly, it is an object of the present invention to provide a photovoltaic device that exhibits high efficiency when employed in a photovoltaic cell.

Another object of the invention is to provide a coating material for a semiconductor-containing photovoltaic device exhibiting high efficiency in a photovoltaic cell.

Yet another object still is to provide a method for producing a photovoltaic device exhibiting highly efficient photocurrent generation in a photovoltaic cell.

These and other objects and advantages of the invention will become apparent from the following description.

SUMMARY OF THE INVENTION

Briefly, the present invention is directed to a heterojunction photovoltaic device, its method of preparation and a process employing such a device for the conversion of energy, especially solar terrestrial energy, into electricity. Photovoltaic devices of the invention are useful in heterojunction photovoltaic cells and radiometric detection cells. In one embodiment, a heterojunction photovoltaic device containing a highly conductive coating material having a band gap from greater than 0 to about 3.0 e.V. on a substrate having a thin layer of insulator-type material at the heterojunction is employed to convert light energy to electrical energy. In a preferred embodiment, a heterojunction photovoltaic device having a coating material containing thallium (III) oxide on a silicon-containing semiconductor is useful in a heterojunction photovoltaic cell.

BRIEF DESCRIPTION OF THE DRAWING

The singular drawing is a greatly enlarged isometric projection of a heterojunction photovoltaic device made in accordance with the present invention.

DETAILED DESCRIPTION OF THE INVENTION

The invention is directed to a heterojunction photovoltaic device containing a highly conductive coating material having a band gap greater than 0 to about 3.0 e.V. on a substrate, and preferably to heterojunction photovoltaic devices containing thallium (III) oxide on a substrate containing a semiconductor. The device of the invention is particularly well suited for use as a semiconductor-insulator-semiconductor heterojunction photovoltaic (S-I-S) cell.

Referring to the drawing, the photovoltaic device of the present invention comprises a semiconductor substrate 20, preferably having a relatively thin layer 22 of insulator material. A coating material layer 24, contiguous with substrate 20 or thin layer 22, if present, forms a heterojunction to the underlying substrate. The "front side" of the photovoltaic device, as used hereinafter, refers to the coating material side of the heterojunction, and conversely, the "back side" refers to the semiconductor substrate side of the heterojunction. "Back" ohmic electrode 26, in contact with a second surface of substrate 20 at one or more points, and "front" ohmic electrode 28, in contact with coating material layer 24 at one or more points, comprise highly conductive materials usually metals. Ohmic electrode 28 of a grid configuration permitting a substantial amount of incident light to pass between the grid configuration. The grid configuration is utilized where the underlying material is of insufficient electrical conductivity to support the current generated by the device. The geometric configuration of electrode 28 may comprise any of a number of alternatives which aim to optimize surface coverage and minimize series resistance of the device, as for example, intra-electrode conducting means 29 interconnecting contact points of electrode 28 and forming a part of electrode 28. Parameters leading to the optimization of the grid configuration include the current generation characteristics of the heterojunction, resistivity of ohmic electrode materials utilized to configure electrode 28 and the resistivity of coating material layer 24. Parameters leading to the optimization of "back" ohmic electrode 26 include the resistivity of the ohmic electrode material 26 and the resistivity and type (i.e. n-type or p-type) for the semiconductor substrate 20. In another embodiment, an adherence layer 30 bonds the ohmic electrode 28 to the coating material layer 24. In operation, light typically irradiates the front side of the device of the invention. The irradiation results in the generation of a photoelectric current from the semiconductor substrate to an external circuit via electral conducting means (not shown) from ohmic electrodes 26 and 28.

The substrate material of the photovoltaic device must be capable of generating electron-hole pairs. Substrates useful in the present electrodes include materials containing at least one semiconductor. Ordinarily, the substrate is in the form of a single crystalline, polycrystalline, or amorphous structure, or combinations thereof. Such materials usually have a band gap from greater than 0 to about 4.0 electron volts (e.V.). Preferably, the substrate comprises at least one semiconductor having a band gap from about 0.5 to about 3.0 e.V.; more preferably from about 0.7 to about 2.5 e.V. and most preferably from about 1.0 to about 1.8 e.V. Oftentimes, two or more semiconductor materials are combined together in various proportions or layers resulting in a final substrate having a desired band gap within the above-mentioned ranges. The semiconductor material contained in the substrate may be either intrinsic materials or suitably doped n-type or p-type materials.

Semiconductor materials for use in the invention preferably contain (1) elemental semiconductors such as selenium, silicon and germanium, (2) the binary group semiconductors such as Group III-V semiconductors including, for example, GaAs, InP, GaP, and AlSb, (3) the Group II-VI semiconductors including, for example, CdS, CdSe, and CdTe, (4) the metal-containing chalcogenides, particularly those containing transition metals such as the selenides, tellurides, and sulfides of tungsten and molybdenum, or (5) the Group I-III-VI ternary semiconductors such as $CuInS_2$, $CuInSe_2$, and $CuInTe_2$. The most highly preferred semiconductor materials are usually selected from the group consisting of silicon, GaAs, InP, CdSe, and GaP.

The photovoltaic device of the invention contains a highly conductive coating material. Preferably, the coating material comprises at least a portion of the outermost layer on a front surface of the device. The coating material is preferably an inorganic semiconductor material, including metal-containing semiconductor materials such as thallium (III) oxide ($Tl_2O_3$), cadmium oxide (CdO), bismuth oxide ($Bi_2O_3$), lead oxide ($PbO_2$), cuprous oxide ($Cu_2O$), chromium oxide $Cr_2O_3$), silver oxide ($Ag_2O$), delafossite- type oxides such as $PtCoO_2$, $PdCoO_2$, $PdRhO_2$, and $PdCrO_2$, as well as ruthenium sulfide ($RuS_2$). The most highly preferred coating material contains thallium (III) oxide.

Coating materials typically have a band gap from greater than 0 to about 3.0 e.V., usually from about 0.5 to about 3.0 e.V., and preferably about 0.5 to about 2.35 e.V. A partial list of band gaps of coating materials useful in the invention are the elemental and/or binary compounds disclosed in W. H. Strehlow and E. L. Cook's *Compilation of Energy Band Gaps in Elemental and Binary Compound Semiconductors and Insulators*, J. Phys. Chem. Ref. Data, Vol. 2, No. 1, 1973, which is herein incorporated by reference. As used herein, the band gap energy represented in electron volts (e.V.) is understood to be the energy required to excite electrons in solid materials from a maximum energy in the valence band to a minimum energy in the conduction band and may be measured by conventional techniques such as absorption or reflection spectroscopy at approximately room temperature, i.e. from about 25° C. to about 30° C.

In addition to having a band gap in the previously mentioned range, the coating material required in the invention should be sufficiently transparent to allow a substantial portion of the light energy to be transmitted to and utilized by the substrate material during its use. The band gap of the coating material is preferably at least as high as, and more preferably higher than, the band gap of the substrate. Ordinarily, the transparency of the coating material is enhanced by employing a thin layer of the coating material with the substrate. Although only a relatively thin layer of the coating material is needed, the substrate may be coated with a layer thicker than about $10^5$ angstroms; however, the substrate should be coated with a thin layer of a thickness preferably less than about $10^5$ angstroms, more preferably less than about $10^4$ angstroms and most preferably less than about $2 \times 10^3$ angstroms.

An unusual feature of the coating material used in the invention is its high conductivity. The conductivity of the coating material is typically greater than that of the substrate material. In general, the conductivity must be sufficient to allow a substantial number of electrons or holes from the photogenerated electron-hole pairs of the substrate to be transported to the front surface of the photovoltaic device or toward the bulk of the substrate, as manifested by a series resistance less than about 100 ohms, preferably less than 10 ohms and most preferably less than one ohm, during operation of a photovoltaic device. Although its band gap is greater than 0, the resistivity of the coating material, as a measure of its conductivity, is generally less than about $10^{-2}$ ohm-cm, preferably less than about $10^{-3}$ ohm-cm, most preferably less than about $10^{-4}$ ohm-cm.

In contrast to the substrate material, it is preferred that the coating material be essentially degenerate, either naturally degenerate or doped to degeneracy. Degeneracy, as used herein, is the condition of a material wherein its Fermi energy level is at least, and preferably greater than that of the minimum energy of its conduction band for an n-type material or, in the case of p-type materials, the Fermi level is at most, and preferably less than, that of the maximum energy of its valence band. An example of a naturally degenerate n-type coating material, as used herein, is thallium (III) oxide. Coating materials doped to degeneracy generally have a doping density of at least $10^{18} cm^{-3}$. Materials used to dope the coating material to degeneracy include either electron donors or acceptors, depending upon the nature of the coating and substrate materials.

Layers of insulating materials may form on the surface of the uncoated substrate utilized in the invention. Such layers, in some cases, may contribute to an increase in the efficiency of a photovoltaic cell. In the heterojunction photovoltaic device of the invention, the coating material contacts and at least, in part, covers such layers of the insulator-type material. The insulator-type material contained in the device may be intentionally formed on the substrate. Layers of the insulator-type materials may be "naturally grown," as by allowing components of air, such as oxygen, to interact with the surface of the substrate, or layers may also be formed by other techniques such as heating the substrate or by conventional deposition. Usually, the insulator-type materials have an average thickness less than about 100 angstroms, preferably between about one and about 50 angstroms and most preferably from about two to about 20 angstroms, as measured by ellipsometry and conventional surface spectroscopy techniques as, for example, the Auger depth profiling technique. Such a material typically has a band gap greater than about 3.0 e.V., preferably greater than 3.6 e.V. and most preferably greater than 4.0 e.V.

An example of the effects of the coating material over insulating materials is demonstrated when the surface of an uncoated n-type silicon-containing substrate is oxidized in contact with air, oxygen or another oxidizing agent from a redox couple so as to produce a thin layer of an oxide of silicon such as silicon dioxide having a band gap greater than 4.0 e.V. Although a silicon dioxide-coated, n-type silicon substrate coated with a wide band gap semiconductor in a conventional photovoltaic cell provides efficiencies of about 11 percent for generating electrical energy, a coating material of the invention, such as thallium (III) oxide, covering the silicon dioxide layer, produces a cell having higher efficiencies.

To prepare the heterojunction photovoltaic device, a front surface of the substrate, preferably containing a portion of the insulator material is compounded with the coating material. The compounding may be accomplished by conventional techniques including vacuum evaporation, sputtering, chemical vapor deposition (CVD), spray pyrolysis and mechanical methods such as brushing, spraying and impregnation. It is preferred to compound the coating material with polished and/or etched substrate materials.

Conventional techniques may be employed for preparing conducting means from the coating material to the external circuit or from the substrate portion to the external circuit of a cell. Ordinarily, ohmic electrode contacts containing conductive materials such as metals, solders, epoxies, eutectics, alloys, and combinations thereof, are formed with the coating material and the substrate portion of the device. The ohmic electrodes, particularly those between the coating material and conducting means to the external circuit, may be constructed as a single-point contact or multiple-point contacts such as perimeter contacts or interconnecting grid configurations. Conducting means to the external circuit, such as a wire, may conveniently be constructed with the device of the invention and components of other heterojunction photovoltaic cells.

Coating materials of the invention, such as thallium (III) oxide, may also be compounded with the substrate by an electrochemical or a photo-assisted electrochemical deposition technique. In the electrochemical deposition technique, the coating material is deposited on the surface of a substrate employed as an anode or cathode in an electrochemical cell that contains a redox couple comprising coating material precursors. The electrochemical cell is preferably biased with electrical energy from an external source, and furthermore, the thickness of the coating material on the substrate may conveniently be controlled by monitoring the current, such as by measuring the coulombs per unit area passed through the cell. Control of the thickness of a particular coating material relative to the coulombs passed through the cell is dependent upon such factors as cell stoichiometry, current efficiency and density of the coating material. A galvanostatic anodization technique may be utilized wherein a constant current is employed in the cell while variation in the voltage occurs during deposition. Substrates containing p-type semiconductors are usually employed as anodes and those containing n-type semiconductors as cathodes.

The electrochemical deposition of a coating material on the substrate is preferably photo-assisted. In this photoelectrochemical deposition technique, the substrate, employed as an anode or cathode or both, absorbs sufficient light during the operation of the cell to generate a photocurrent, and the coating material is deposited on the substrate from a redox couple typically contained in a liquid containing the coating material precursor. Ordinarily, the cell is biased, and in this case, substrates containing n-type semiconductors are employed as anodes and p-type semiconductors as cathodes.

An unusual feature of the invention is a photo-assisted potentiostatic deposition technique for depositing the coating material onto the semiconductor-containing substrate, especially in the preparation of relatively thin films of the coating material on the photovoltaic device. In such a technique, a constant voltage is employed in the cell while the current tends to pass through a maximum range of values during the time of cell operation. The average thickness of the coating material of the invention is preferably optimized when the deposition process is stopped at such time that the photocurrent approaches within 20 percent of, and preferably reaches, its maximum value. Such a technique results in highly uniform layers of the coating material on the semiconductor-containing substrate, and the photovoltaic device prepared therefrom exhibits a more efficient heterojunction photovoltaic cell than photovoltaic devices prepared by galvanostatic anodization techniques. It is believed that high uniformity is due to the deposition rate being fastest where the film is thinnest.

Although biasing of the electrochemical cell during production of the photovoltaic device of the invention is usually done with an external source of electrical energy to the cell, an internal source of energy may serve to replace all or part of the electrical biasing. Such a variation is the electroless deposition process wherein electrical biasing is replaced by the energy generated from the oxidation and/or reduction of a selected redox couple. The electroless deposition process is preferably photo-assisted. Furthermore, the electroless deposition technique may be utilized to deposit any coating material having a band gap less than about 4.0 e.V., preferably highly conductive coating materials, onto any substrates disclosed hereinbefore, having band gaps from greater than 0 to about 4.0 e.V. For example, a photoelectroless deposition of a coating material on a semiconductor may be employed to prepare any heterojunction photovoltaic device, including metals and wide band gap (i.e. >3.0 e.V.) semiconductors on any substrate, particularly semiconductors.

In a highly preferred embodiment for preparing a photovoltaic device of the invention, a thallium (III) oxide containing coating material is electrochemically deposited on an n-type silicon semiconductor substrate at the anode of the electrochemical cell. During operation, such a cell is preferably electrically biased, and light is directed toward the n-type silicon anode while a thallium (I) ion-containing solution is oxidized to thallium (III)containing components on the silicon surface The galvanostatic anodization technique is preferred, and the potentiostatic anodization deposition technique is most highly preferred, especially for relatively thin films of thallium (III) oxide such as films less than about 2000 angstroms thick. Ohmic electrodes, containing such highly conductive materials as silver epoxy or gallium/indium, are attached to the thallium (III) oxide surface and to the n-type silicon surface.

The photovoltaic devices prepared in accordance with the invention are employed under conditions suited for their intended purposes, as for example, in a process for generating either relatively small or large photocurrents in a photovoltaic cell. Typically, only a small photocurrent is needed when the device is employed in radiometric detection cells that measure light intensities, whereas large photocurrents, such as those greater than about one milliamp/cm$^2$, may be desirable in commercial generation of electricity. In one embodiment, light irradiates a photovoltaic cell comprising a heterojunction photovoltaic device of the invention containing a semiconductor having an insulator-type layer having a thickness of about 10 to about 20 angstroms between a highly conductive degenerate coating material and the semiconductor. The device of the invention efficiently utilizes the available light during operation of the heterojunction photovoltaic cell. The efficiency of a photovoltaic cell employing the photovoltaic device of the invention is usually greater than 5 percent, preferably greater than about 10 percent and most preferably greater than about 14 percent.

The efficiency of a photovoltaic cell, as used hereinafter, is determined by the ratio of the power output to the power input. The power input is typically the light irradiating the surface of the photovoltaic device containing the coating material while the power output is electricity. As used herein, the percent efficiency of a photovoltaic cell may be defined according to the following equation:

$$\text{Efficiency (percent)} = \frac{j_{sc} \times V_{oc} \times ff \times 100}{P}$$

wherein $j_{sc}$ is the short-circuit photocurrent density usually measured in mA/cm$^2$, wherein $V_{oc}$ is the open-circuit photovoltage V, wherein P is the irradiance usually measured in mW/cm$^2$ and wherein ff is the fill factor usually measured as the ratio of the product of the cell voltage and the photocurrent density at the maximum power point $(V_{max} \times j_{max})$ to $(V_{oc} \times j_{sc})$, i.e.

$$ff = \frac{(V_{max} \times j_{max})}{(V_{oc} \times j_{sc})}$$

A feature of the invention is the consistency of the photovoltaic device for exhibiting relatively high cell efficiencies when irradiated at both relatively low and high intensities. As shown in the examples hereinafter disclosed, a photovoltaic device of the invention exhibits greater than 12 percent photovoltaic efficiency when irradiated by light intensities as low as 14 mW/cm$^2$ or as high as 437 mW/cm$^2$. Also, at light intensities near Air Mass One (approximately 93.8 and 110 mW/cm$^2$), the device exhibits efficiencies of 12.9 and 13.6 percent, respectively. Such consistency allows the photovoltaic device of the invention the benefit of being combined with means for concentrating the light intensity that ultimately irradiates the device, especially when the available light intensity is relatively low. Light concentration means may include geometrically shaped reflectors, concentrating lenses such as Fresnel-type, or luminescent solar collectors that optimize the concentration of light irradiating the device of the invention. Light concentration means constructed together with a device of the invention having multiple-point contacts on a front side ohmic electrode provides a photovotaic cell exhibiting high efficiency. Photovoltaic efficiency may be maintained when light intensities are concentrated by a factor of at least two, preferably at least 10 and most preferably at least 20.

The invention is further illustrated by the following examples which are illustrative of specific modes of practicing the invention and are not intended as limiting the scope of the invention defined by the appended claims.

EXAMPLE I

An ohmic contact is formed with gallium/indium eutectic on the back of a 15 mil thick silicon n-type substrate material doped with phosphorus to a volume resistivity of 1.2–2.0 ohm-cm, having been etched with a 10 percent HF solution. A copper wire is attached to the ohmic contact with conducting silver epoxy and all surfaces, except the front, are sealed in a glass tube with insulating epoxy and silicone sealant.

The front surface is polished to a mirror finish and placed in an alkaline (pH 14) solution of 0.5 M thallium (I) acetate and electrolyzed at a constant potential (i.e. potentiostatic anodization) of 0.0 V vs. SCE (Saturated Calomel Electrode) and irradiated at 110 mW/cm$^2$ (Xenon irradiation) while the anodic current density increases to a maximum. Approximately 0.1 anodic coulombs per square centimeter of charge passes such that the deposition on the silicon is stopped when the thallium (III) oxide has an average thickness of about 700 to about 1,500 angstroms. A front ohmic contact is formed with the thallium (III) oxide coating surface by attaching a copper wire with conducting silver/epoxy around the perimeter of the front surface of the deposited substrate.

During operation of the photovoltaic device, the copper wires are attached to the external circuit, the thallium (III) oxide-coated front surface is irradiated with a Xenon lamp and photovoltaic characteristics are monitored with a Keithley Model 619 Electrometer/Multimeter and Princeton Applied Research Model 175 Universal Programmer. The observed photovoltaic characteristics, including efficiencies, when the cell is irradiated at different intensities are summarized in Table I.

TABLE I

| PHOTOVOLTAIC CHARACTERISTICS | | | | |
|---|---|---|---|---|
| Xenon Irradiance (mW/cm$^2$) | Open-Circuit Photovoltage (V) | Short-Circuit Photocurrent Density (mA/cm$^2$) | Fill Factor | Photovoltaic Efficiency (%) |
| 14.0 | 0.405 | 6.12 | 0.698 | 12.3 |
| 27.5 | 0.420 | 11.9 | 0.708 | 12.9 |
| 39.2 | 0.435 | 16.8 | 0.703 | 13.1 |
| 49.6 | 0.450 | 22.3 | 0.692 | 14.0 |
| 59.3 | 0.454 | 25.8 | 0.682 | 13.5 |
| 76.9 | 0.460 | 33.9 | 0.676 | 13.7 |
| 93.8 | 0.459 | 39.1 | 0.675 | 12.9 |
| 110 | 0.475 | 47.7 | 0.659 | 13.6 |

TABLE I-continued
PHOTOVOLTAIC CHARACTERISTICS

| Xenon Irradiance (mW/cm$^2$) | Open-Circuit Photovoltage (V) | Short-Circuit Photocurrent Density (mA/cm$^2$) | Fill Factor | Photovoltaic Efficiency (%) |
|---|---|---|---|---|
| 218 | 0.475 | 94.8 | 0.655 | 13.5 |
| 437 | 0.494 | 194 | 0.582 | 12.8 |

EXAMPLE II

A photovoltaic device is prepared in a similar manner to that of Example I, except the photoelectrodeposition of thallium (III) oxide results from an irradiation with 14.1 mW/cm$^2$ Xenon light and the front ohmic contact is prepared by mechanically pressing a platinum wire to the thallium (III) oxide front surface at a point approximately equidistant from the perimeter.

The observed photovoltaic characteristics, including efficiency, during operation of the above-mentioned device irradiated at 14.1 mW/cm$^2$ Xenon light intensity are summarized as follows:

| | |
|---|---|
| Short circuit photocurrent, $j_{sc}$ | 5.18 mA/cm$^2$ |
| Open circuit photovoltage, $V_{oc}$ | 0.425 V |
| Fill factor, ff | 0.607 |
| Efficiency, percent | 9.5 |

EXAMPLE III

A photovoltaic device is prepared in a similar manner to that of Example I, except the silicon is etched with CP4A solution containing 3 parts HF (conc.), 5 parts HNO$_3$ (conc.), and 3 parts HCH$_3$COOH (glacial) by volume and is electrolyzed at a constant anodic current density (i.e. galvanostatic anodization) of 30 mA/cm$^2$ under intense Xenon irradiation (150 mW/cm$^2$). A total of approximately 0.15 coulombs/cm$^2$ of charge is passed and the deposition of thallium (III) oxide is stopped at an average thickness of about 1000 to 2000 angstroms.

The observed photovoltaic characteristics, including efficiency, during operation of the above-mentioned device irradiated at 13.5 mW/cm$^2$ Xenon light intensity are summarized as follows:

| | |
|---|---|
| Short circuit photocurrent, $j_{sc}$ | 5.48 mA/cm$^2$ |
| Open circuit photovoltage, $V_{oc}$ | 0.349 V |
| Fill factor, ff | 0.625 |
| Efficiency, percent | 8.85 |

While particular embodiments of the invention have been described, it will be understood, of course, that the invention is not limited thereto since many obvious modifications can be made, and it is intended to include within this invention any such modifications as will fall within the scope of the invention as defined by the appended claims.

I claim:

1. A photovoltaic device comprising a conductive solid coating material containing a degenerate n-type semiconductor having a band gap from about 0.5 to about 2.35 e.V. forming a heterojunction with a solid substrate containing an n-type semiconductor material.

2. The device defined in claim 1 wherein said coating material has a resistivity less than said substrate.

3. The device defined in claim 1 wherein said semiconductor contained in said substrate has a band gap from about 0.5 to about 4.0 e.V.

4. The device defined in claim 1 wherein said coating material has a resistivity less than about 10$^{-2}$ ohm-cm, measured at room temperature.

5. The device defined in claim 1 wherein said coating material has a band gap at least equal to or greater than the band gap of said substrate.

6. The device defined in claim 1 wherein said semiconductor contained in said substrate is selected from the group consisting of Si, GaAs, InP, CdSe, and GaP.

7. The device defined in claim 1 wherein said coating material is doped to degeneracy.

8. The device defined in claim 1 wherein said coating material is naturally degenerate.

9. The device defined in claim 1 further comprising a front ohmic electrode on said coating material having a grid configuration.

10. The device defined in claim 1 wherein said coating material has a resistivity less than about 10$^{-3}$ ohm-cm, measured at room temperature.

11. The device defined in claim 1 wherein said coating material is selected from the group consisting of Tl$_2$O$_3$, CdO, Bi$_2$O$_3$, PbO$_2$, Cu$_2$O, Cr$_2$O$_3$, Ag$_2$O, RuS$_2$, PtCoO$_2$, PdCoO$_2$, PdRhO$_2$, and PdCrO$_2$.

12. The device defined in claim 1 further comprising a thin layer of material having a band gap greater than about 3.0 e.V. between said semiconductor material and said coating material.

13. A photovoltaic cell comprising the photovoltaic device of claim 1.

14. The cell defined in claim 13 in which the series resistance is less than about 100 ohms.

15. The cell defined in claim 13 producing greater than about one mA/cm$^2$ of photocurrent.

16. The cell defined in claim 13 further comprising means for concentrating light intensity.

17. A radiometric detection cell comprising the photovoltaic device of claim 1.

18. The device defined in claim 1 comprising a photovoltaic cell having an efficiency greater than about 5 percent.

19. A photovoltaic device comprising a coating material containing a degenerate n-type semiconductor having a band gap from about 0.5 to about 2.35 e.V. and a resistivity less than about 10$^{-2}$ ohm-cm, said coating material forming a heterojunction with a substrate containing an n-type semiconductor, said device containing a layer of insulating material at said heterojunction.

20. The device defined in claim 19 comprising a photovoltaic cell having an efficiency greater than about 5 percent.

21. The device defined in claim 19 wherein said semiconductor contained in said substrate has a band gap from about 0.5 to about 4.0 e.V.

22. The device defined in claim 19 wherein said coating material has a resistivity less than about 10$^{-4}$ ohm-cm, measured at room temperature.

23. The device defined in claim 19 wherein said semiconductor contained in said substrate is selected from the group consisting of Si, GaAs, InP, CdSe, and GaP.

24. The device as defined in claim 19 wherein said coating material is selected from the group consisting of Tl$_2$O$_3$, CdO, Bi$_2$O$_3$, PbO$_2$, Cu$_2$O, Cr$_2$O$_3$, Ag$_2$O, RuS$_2$, PtCoO$_2$, PdCoO$_2$, PdRhO$_2$, and PdCrO$_2$.

25. A photovoltaic device comprising a coating material containing degenerate n-type thallium (III) oxide on a substrate containing an n-type semiconductor.

26. The device defined in claim 25 wherein said substrate forms a heterojunction with said thallium (III) oxide.

27. The device defined in claim 26 wherein a material having a band gap greater than about 4.0 e.V. comprises a thin layer at said heterojunction.

28. The device defined in claim 26 wherein said semiconductor contained in said substrate has a band gap from about 0.7 to about 2.5 e.V.

29. The device defined in claim 26 wherein said semiconductor contained in said substrate comprises n-type silicon.

30. The device defined in claim 29 further comprising a layer comprising silicon dioxide having an average thickness of about one to about 50 angstroms and located at said heterojunction between said n-type silicon and said thallium (III) oxide.

31. The device defined in claim 26 wherein said n-type semiconductor is selected from the group consisting of Si, GaAs, InP, CdSe, and GaP.

32. The device defined in claim 25 wherein said thallium (III) oxide is contained on at least a portion of an outermost layer on a front surface of said device.

33. The device defined in claim 25 wherein said thallium (III) oxide is dispersed on said substrate to an average thickness of less than $10^5$ angstroms.

34. The device defined in claim 25 wherein said substrate has a band gap equal to or less than the band gap of said thallium (III) oxide.

35. A photovoltaic cell comprising the photovoltaic device of claim 18.

36. The cell defined in claim 35 in which the series resistance is less than about 100 ohms.

37. The cell defined in claim 35 wherein said semiconductor contained in said substrate comprises n-type silicon.

38. The cell defined in claim 35 producing a photocurrent greater than about one mA/cm$^2$.

39. The cell defined in claim 35 further comprising means for concentrating light intensity, said means comprising a reflector.

40. The cell defined in claim 35 further comprising means for concentrating light intensity, said means comprising a lens.

41. The cell defined in claim 35 further comprising means for concentrating light intensity, said means comprising a luminescent solar collector.

* * * * *